United States Patent
Chuang et al.

(10) Patent No.: US 6,411,509 B1
(45) Date of Patent: Jun. 25, 2002

(54) TUBE-CONDUCTING FAN ASSEMBLY (75) Inventors: Te-Tsai Chuang; Kuo-Cheng Lin; Wen-Shi Huang, all of Taoyuan Hsien (TW)

(73) Assignee: Delts Electronics, Inc. (TW)

( * ) Notice: Subject to any disclaimer, the term of this patent is extended or adjusted under 35 U.S.C. 154(b) by 0 days.

(21) Appl. No.: 09/717,879

(22) Filed: Nov. 21, 2000

(30) Foreign Application Priority Data

Apr. 7, 2000 (TW) ...................................... 89205573 U (51) Int. Cl.$^7$ ................................................ H05K 7/20
(52) U.S. Cl. ...................... 361/695; 165/80.3; 165/121; 415/220; 417/423.1
(58) Field of Search ............................. 415/178, 213.1, 415/214.1, 220, 223, 182.1; 174/16.1, 16.3; 310/68 C, 68 D; 312/236; 454/184; 165/80.3, 121–126; 361/687, 694, 695, 696, 697, 717–719; 417/423.1

(56) References Cited

U.S. PATENT DOCUMENTS

| | | | | |
|---|---|---|---|---|
| 4,152,094 A | * | 5/1979 | Honda et al. ............... | 415/119 |
| RE34,154 E | * | 1/1993 | Lee ............................. | 62/285 |
| 5,497,825 A | * | 3/1996 | Yu ............................. | 165/11.1 |
| 5,673,747 A | * | 10/1997 | Kousaka et al. ............... | 165/41 |
| 5,706,170 A | * | 1/1998 | Glovatsky et al. ............ | 361/695 |
| 6,135,098 A | * | 10/2000 | Allen et al. .................. | 123/565 |

* cited by examiner

*Primary Examiner*—Gerald Tolin
(74) *Attorney, Agent, or Firm*—Alston & Bird LLP (57) ABSTRACT

A fan assembly is disclosed includes a guiding tube having a curved part in the middle of the guiding tube and two straight parts in both ends of the guiding tube, and a fan inclinedly assembled in the curved part of the guiding tube. One end of the guiding tube is used to be an outlet and the other is used to be an inlet. The fan is used for drawing in a gas current from the inlet and blowing the gas current out of the outlet on a heat-generating device through the curved and the straight parts of the guiding tube. Therefore, as the gas current is blown through the curved and the straight parts of the guiding tube, the gas current blown on the heat-generating device is evened so as to improve the heat-dissipating efficiency.

6 Claims, 7 Drawing Sheets

TUBE-CONDUCTING FAN ASSEMBLY

FIELD OF THE INVENTION

The present invention is related to a fan assembly, and especially to a fan assembly disposed in a curved part of the guiding tube.

BACKGROUND OF THE INVENTION

As the size of an electronic devices are getting smaller and smaller, the heat-generating amount in a unit area of the electronic device is increased seriously. Therefore, how to increase the heat-dissipating efficiency is a very important task.

The heat generated from an electronic device is usually dissipated by using a fan assembly. There are many kinds of fan assemblies. Some includes a fan disposed on a high-powered electronic device, such as the central processing unit (CPU) for carrying the heat by gas current, and some includes a fan disposed on the computer case for increasing the heat convection in the case. Among them, a specific kind of fan assembly, call "tube-conducting fan assembly", which composed of a fan disposed on a guiding tube for guiding the gas current generated from the fan on the electronic device directly is getting more and more attention because the heat-dissipating efficiency of the fan assembly is high.

Figure 1:
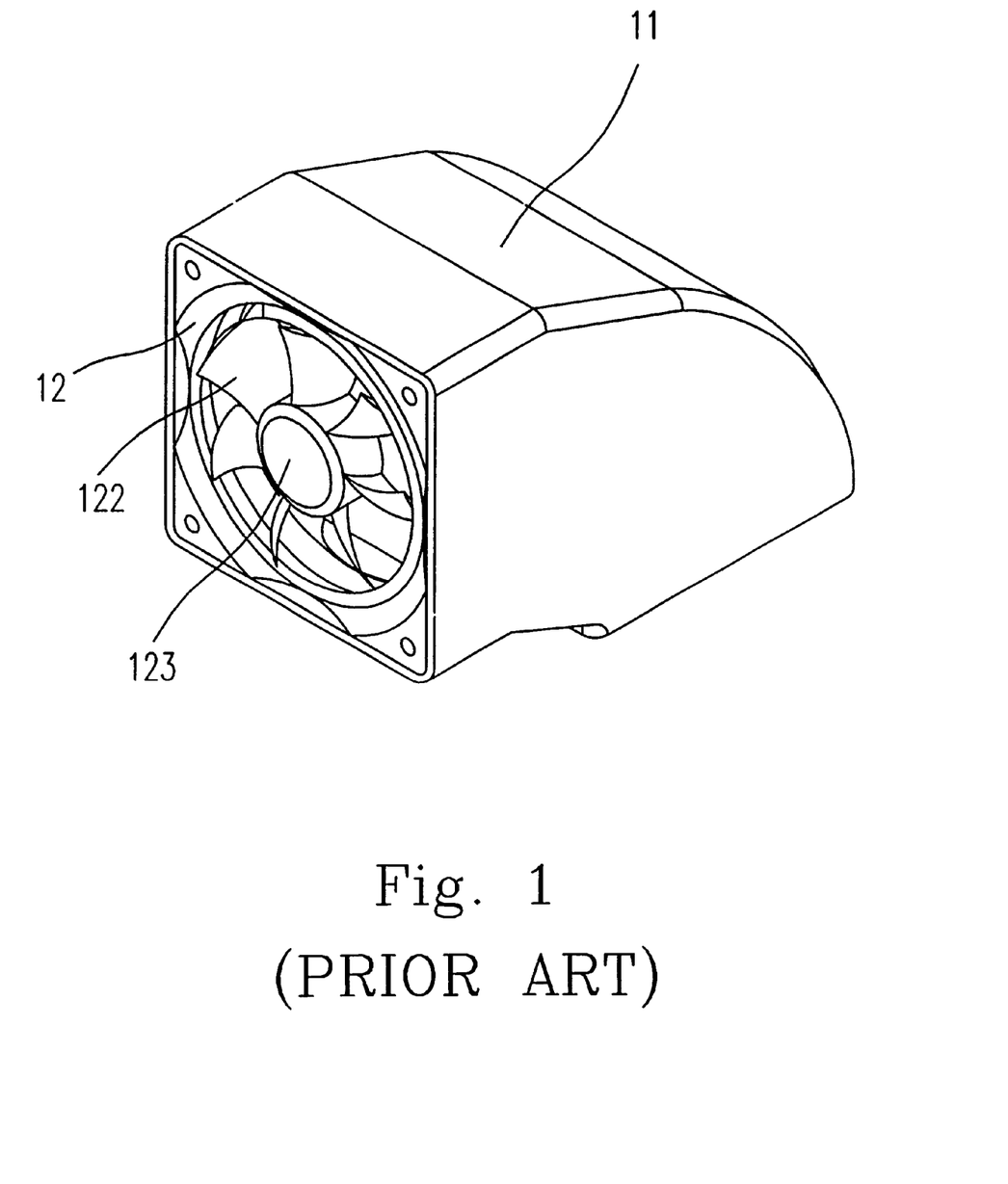
FIG. 1 schematically shows the conventional rear-hang tube-conducting fan assembly.
Figure 2:
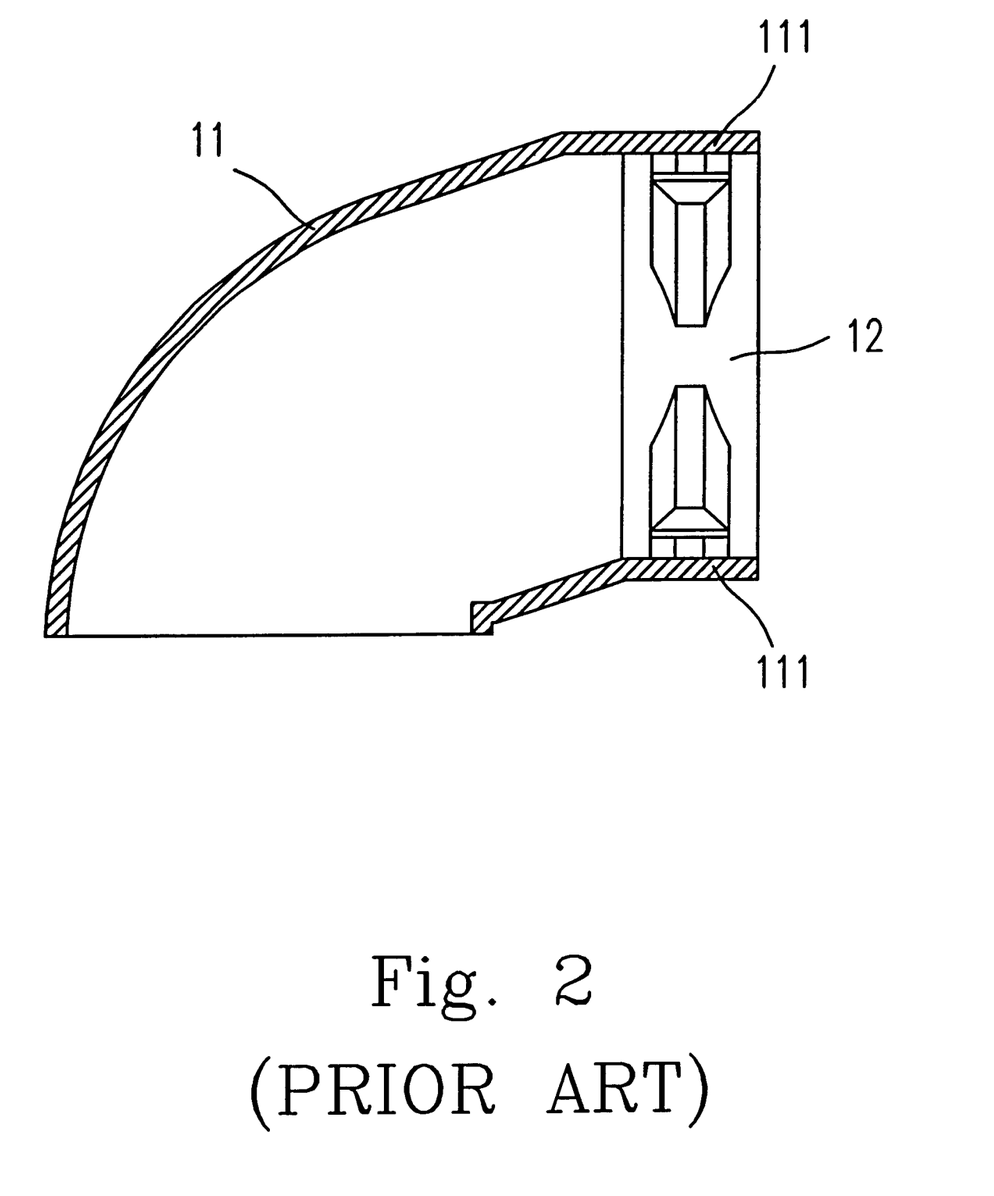
FIG. 2 is a sectional diagram of the conventional rear-hang tube-conducting fan assembly shown in FIG. 1.

FIG. 1 schematically shows the conventional rear-hang tube-conducting fan assembly and FIG. 2 is its sectional diagram. The rear-hang tube-conducting fan assembly includes a fan 12 lodged in the inner wall 111 of a guiding tube 11. The fan 12 is composed of a stator 123 in the center with a plurality of blades 122 around the stator 123. When the blades 122 of the fan 12 are rotating, gas current can be sucking in or blowing out of the guiding tube 11 to improve the heat-dissipating efficiency on a heat-generating device.

Figure 3:
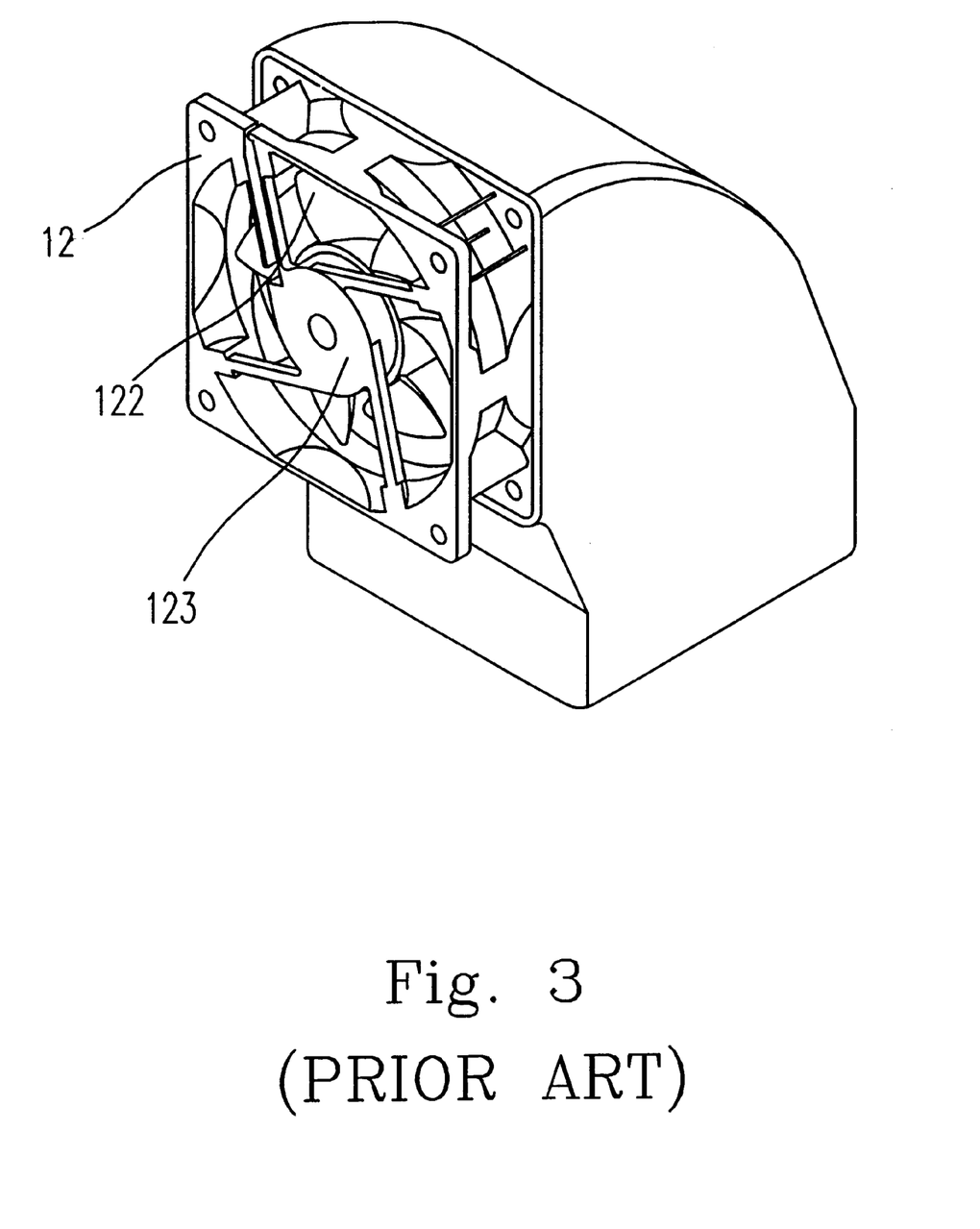
FIG. 3 schematically shows the conventional front-hang tube-conducting fan assembly.
Figure 4:
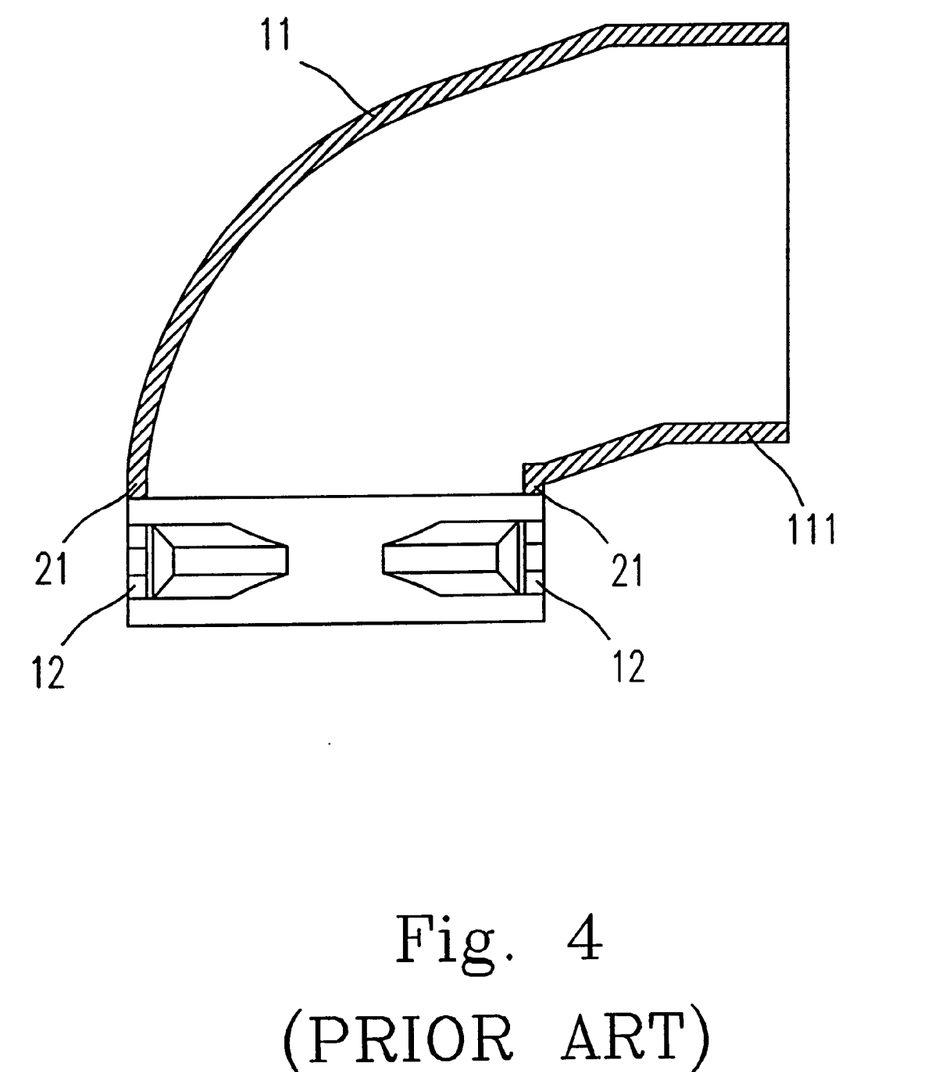
FIG. 4 is a sectional diagram of the conventional front-hang tube-conducting fan assembly shown in FIG. 3.

FIG. 3 schematically shows the conventional front-hang tube-conducting fan assembly and FIG. 4 is its sectional diagram. The front-hang tube-conducting fan assembly includes a fan 12 directly locked on the outer edge 21 of a guiding tube 11. The fan 12 is composed of a stator 123 in the center with a plurality of blades 122 around the stator 123. When the blades 122 of the fan 12 are rotating, gas current can be sucking in or blowing out of the guiding tube 11 to improve the heat-dissipating efficiency on a heat-generating device.

Figure 5:
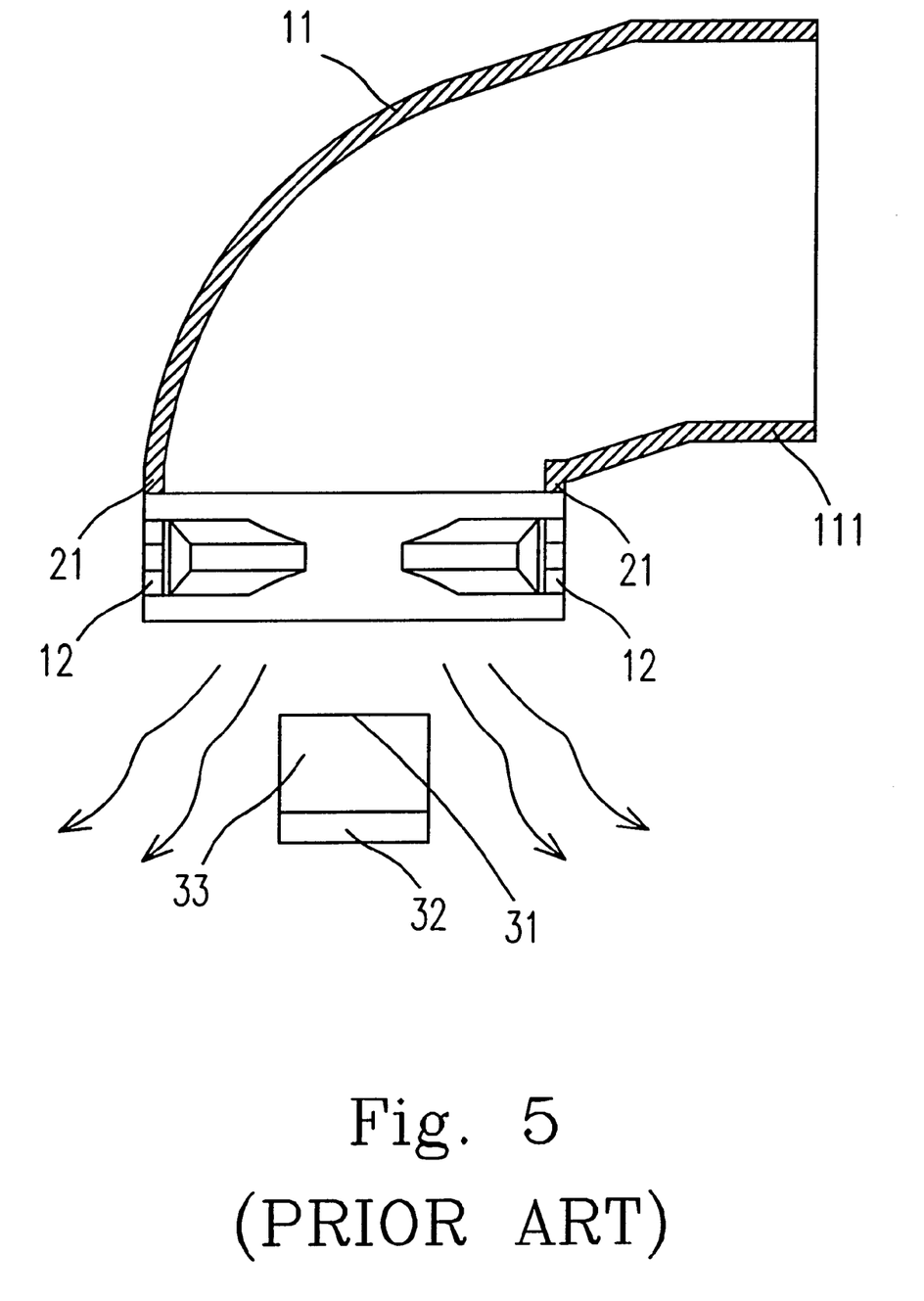
FIG. 5 schematically shows the situation when a tube-conducting fan assembly is dissipating heat from a heat-generating device.

FIG. 5 schematically shows the situation when a tube-conducting fan assembly is dissipating heat from a heat-generating device. The fan 12 has to be disposed very close to the heat-generating device 32 and the radiator plate 33 in order to provide a strong gas current on the radiator plate 33 of the heat-generating device 32. However, since the stator 123 is disposed in the center of the fan 12, when the blades 122 of the fan 12 are rotating, the gas current can not be blown on the entire surface of the radiator plate 33, especially the center part 31 of the radiator plate 33, because the gas current is blocked by the stator 123.

In conclusion, the conventional tube-conducting fan assembly has some drawbacks as follows:
1. The heat-dissipating efficiency in the center part of the radiator plate of the heat-generating device is poor.
2. The length of the guiding tube is long. The long tube will decrease the heat-dissipating efficiency.

It is therefore attempted by the present applicant to deal with the above situation encountered with the prior art.

SUMMARY OF THE INVENTION

An object of the present invention is to provide a novel tube-conducting fan assembly which assembles the fan and the guiding tube together with a special structure and this structure can provide a better heat-dissipating efficiency.

Another object of the present invention is to provide a novel tube-conducting fan assembly which improves the heat-dissipating efficiency in the center part of the radiator plate of the heat-generating device.

The fan assembly of the present invention includes a guiding tube and a fan. The guiding tube has a curved part in the middle of the guiding tube and two straight parts in both ends of the guiding tube. One end of the guiding tube is used to be an outlet and the other is used to be an inlet. The fan is inclinedly assembled in the curved part of the guiding tube for drawing in a gas current from the inlet and blowing the gas current out of the outlet on a heat-generating device through the curved and the straight parts of the guiding tube. Therefore, as the gas current is blown through the curved and the straight parts of the guiding tube, the gas current blown on the heat-generating device is evened so as to improve the heat-dissipating efficiency.

According to the present invention, the shapes of the guiding tube, the inlet and the outlet are tetragonal. Preferably, the fan is an axial-flow fan, and the heat-generating device is a central processing unit (CPU).

The present invention may best be understood through the following description with reference to the accompanying drawings, in which.

DETAILED DESCRIPTION OF THE PREFERRED EMBODIMENTS

Figure 6:
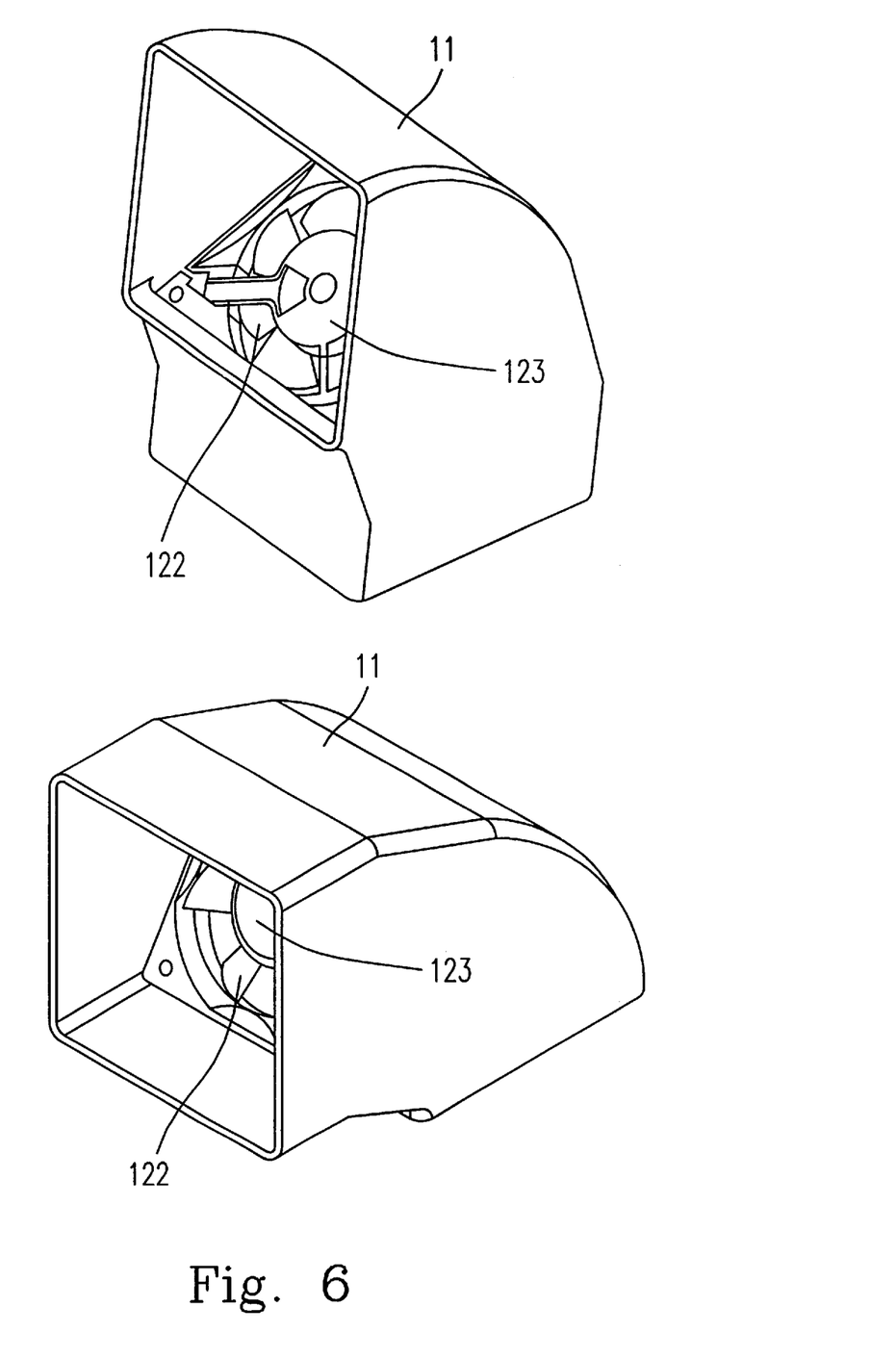
FIG. 6 schematically shows the tube-conducting fan assembly of the present invention.
Figure 7:
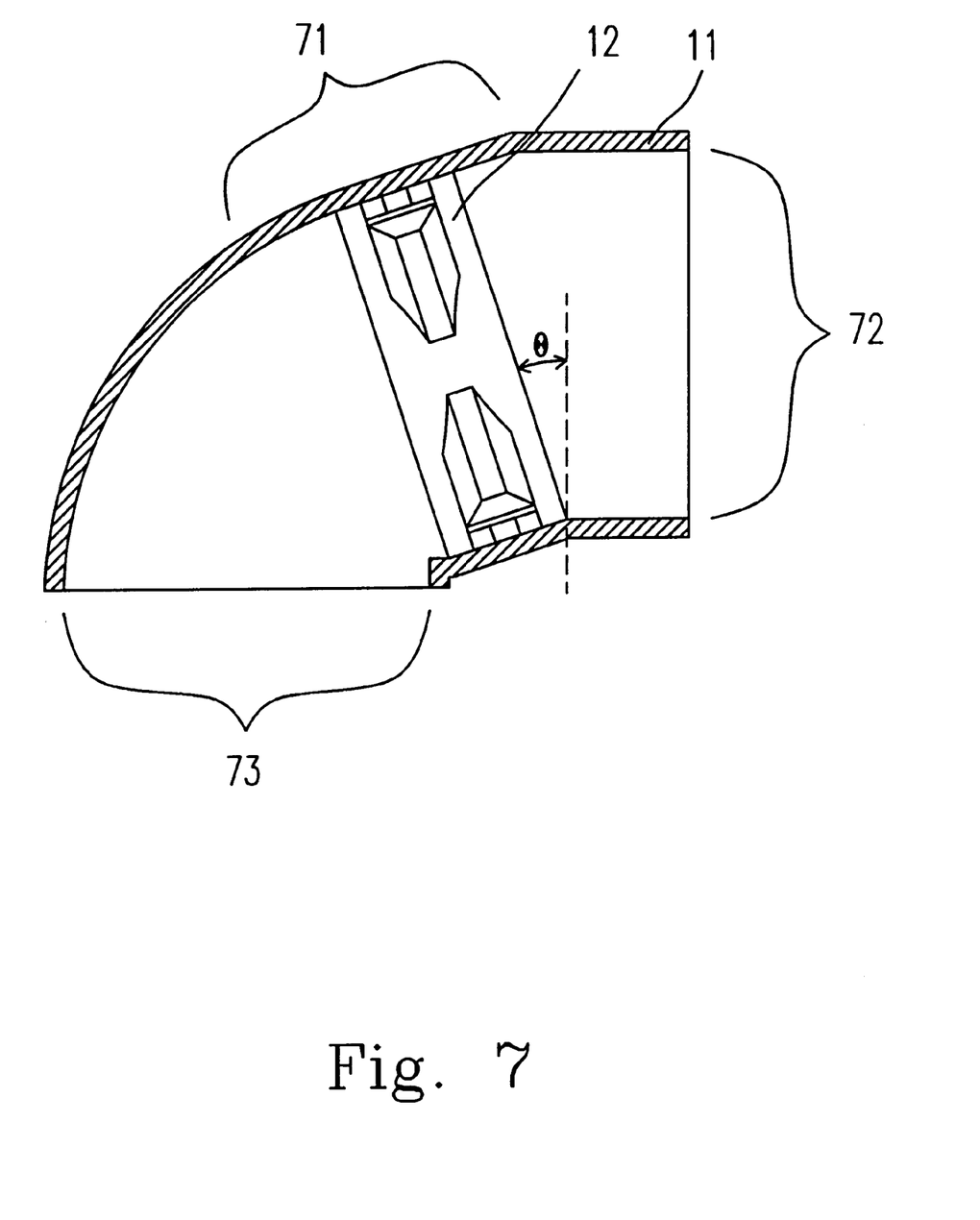
FIG. 7 is a sectional diagram of the tube-conducting fan assembly of the present invention shown in FIG. 6.

FIG. 6 schematically shows the tube conducting fan assembly of the present invention and FIG. 7 is its sectional diagram. The fan assembly of the present invention includes a guiding tube 11 and a fan 12. The guiding tube has a curved part 71 in the middle of the guiding tube 11 and two straight parts in both ends of the guiding tube. One end of the guiding tube is used to be an outlet 72 and the other is used to be an inlet 73. The fan 12 is inclinedly assembled at the curved part 71 of the guiding tube 11 for drawing in an gas current from the inlet 73 or blowing the gas current out of the outlet 72 on a heat-generating device. Since the curved part 71 has a distance with the inlet 73 and the outlet 72, the gas current blown out of the outlet 72 can be evened. Therefore, the gas current can be blown on the entire surface of the radiator plate, especially the center part of the radiator plate, so as to improve the heat-dissipating efficiency.

A characteristic of the present invention is that the fan is disposed in the curved part of the guiding tube inclinedly so as to improve the heat-dissipating efficiency. Technologically, the guiding tube is preferably a tetragonal tube and the shapes of the inlet and outlet are also tetragonal.

In addition, the fan is preferably an axial-flow fan, and the heat-generating device is an electronic device, such as a central processing unit (CPU).

In conclusion, the tube-connecting fan assembly of the present invention has some advantages as follows:

1. The fan is disposed inside the guiding tube so that the noise of the fan is released.
2. Since there is a distance between the fan and the heat-generating device, the gas current blown out of the outlet can be evened so as to improve the heat-dissipating efficiency in the center part of the heat-generating device.
3. The inclined degree of the fan can be changed according to different situations. Conventionally, the size of the fan should be the same to that of the outlet or inlet of the guiding tube. However, for the present fan assembly, the size of the fan should not be the same to that of the guiding tube fan can be larger than that of the guiding tube so that the heat-dissipating efficiency is increased.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fan assembly comprising:

a guiding tube having a curved part in the middle of said guiding tube and two straight parts in both ends of said guiding tube, wherein one end of said guiding tube is used to be an outlet and the other is used to be an inlet, said inlet and outlet not being in axial alignment; and an axial flow fan inclinedly assembled with respect to the horizontal and vertical in said curved part of said guiding tube for drawing in a gas current from said inlet and blowing said gas current out of said outlet on a heat-generating device through said curved and said straight parts of said guiding tube, thereby as said gas current is blown through said curved and said straight parts of said guiding tube, said gas current blown on said heat-generating device is evened so as to improve the heat-dissipating efficiency.

2. The fan assembly according to claim 1, wherein a shape of said outlet is tetragonal.

3. The fan assembly according to claim 1, wherein a shape of said inlet is tetragonal.

4. The fan assembly according to claim 2, wherein a shape of said guiding tube is tetragonal.

5. The fan assembly according to claim 1, wherein said heat-generating device is an electronic device.

6. The fan assembly according to claim 1, wherein said heat-generating device is a central processing unit (CPU).

* * * * *

UNITED STATES PATENT AND TRADEMARK OFFICE
CERTIFICATE OF CORRECTION

PATENT NO. : 6,411,509 B1 Page 1 of 1
DATED : June 25, 2002
INVENTOR(S) : Chuang et al.

It is certified that error appears in the above-identified patent and that said Letters Patent is hereby corrected as shown below:

<u>Title page,</u>
Item [73], Assignee, "Delts" should read -- Delta --.

Signed and Sealed this

Third day of September, 2002

*Attest:*

*Attesting Officer*

JAMES E. ROGAN
*Director of the United States Patent and Trademark Office*